United States Patent [19]

Nakano et al.

[11] Patent Number: 5,796,132

[45] Date of Patent: Aug. 18, 1998

[54] SEMICONDUCTOR DEVICE

[75] Inventors: Hirofumi Nakano; Osamu Ishihara, both of Tokyo, Japan

[73] Assignee: Mitsubishi Denki Kabushiki Kaisha, Tokyo, Japan

[21] Appl. No.: 910,349

[22] Filed: Aug. 13, 1997

Related U.S. Application Data

[63] Continuation of Ser. No. 566,091, Dec. 1, 1995.

[30] Foreign Application Priority Data

Jul. 14, 1995 [JP] Japan .................... 7-178732

[51] Int. Cl.⁶ .................... H01L 31/0328; H01L 29/80
[52] U.S. Cl. .................... 257/284; 257/190; 257/192; 257/194; 438/167; 438/571; 438/577
[58] Field of Search .................... 257/280, 283, 257/284, 410, 411, 192, 194, 190; 437/203, 235, 236

[56] References Cited

U.S. PATENT DOCUMENTS 4,733,283  3/1988  Kuroda .................... 257/284
5,347,141  9/1994  Wybourne et al. .................... 257/24
5,362,677  11/1994  Sakamoto et al. .................... 437/203
5,393,990  2/1995  Kohn .................... 257/12
5,430,310  7/1995  Shibasaki et al. .................... 257/190
5,486,710  1/1996  Kitano .................... 257/284

FOREIGN PATENT DOCUMENTS

0601541A2  7/1993  European Pat. Off. .................... 257/194
601541-A1  7/1994  European Pat. Off. .................... 257/194
5275455  10/1993  Japan .

*Primary Examiner*—Valencia Martin Wallace
*Attorney, Agent, or Firm*—Leydig, Voit & Mayer

[57] ABSTRACT

On a semiconductor substrate with an active layer, a first-stage recess groove is formed by photolithography and wet or dry etching. On the semiconductor substrate and the surface of the first-stage recess groove, a surface passivation film a crystalline material such as i-GaAs or an insulating film of, e.g., SiON, is formed. The surface passivation film on an area where an ohmic electrodes is to be formed is removed and the ohmic electrode is formed on the area by vapor deposition. Thereafter, in the first-stage recess groove, a second-stage recess groove is formed by photolithography and wet or dry etching. A gate electrode is formed on the second-stage recess groove by sputtering or the like.

7 Claims, 5 Drawing Sheets

SEMICONDUCTOR DEVICE

This disclosure is a continuation of patent application Ser. No. 08/566,091, filed Dec. 1, 1995, now abandoned.

BACKGROUND OF THE INVENTION

The present invention relates to a compound semiconductor device, particularly an MES (Metal Semiconductor) type transistor, and its fabricating method.

FIGS. 9A to 9H are sectional views showing the structure of a two-stage recess type FET, a conventional semiconductor device, and a method of fabricating it. Reference numeral 1 denotes a semiconductor substrate; 2 an active layer; 3 a first-stage recess groove; 4 a second-stage recess groove; 7 an ohmic electrode; 8 a gate electrode; and 9–13 resists.

As shown in FIG. 9A, an active layer 2 is formed on a semiconductor substrate 1 of GaAs, InP, etc. by crystal growth such as MBE, MOCVD, etc, ion implantation or diffusion. As shown in FIG. 9B, a resist 9 is patterned into a desired area, isolated by dielectric injection and thereafter removed. As shown in FIG. 9C, a resist 10 for forming an ohmic electrode is formed into a desired area, and an ohmic electrode metal is deposited on the entire surface by vapor deposition. The resultant substrate is dipped in solvent such as acetone to remove the resist and the film deposited on the resist 10, thus providing a pattern such as shown in FIG. 9D. The structure thus formed is heat-treated at the temperature of 400° C. or lower to sinter the ohmic electrodes. As shown in FIG. 9E, in order to form the first-stage recess groove 3, the resist 13 is patterned, and thereafter, by wet etching using tartaric acid or dry etching using hydrochloric acid gas, the first-stage recess groove 3 having a depth of 500–4000 Å is etched.

After removing the resist 13, the resist 11 for forming a second-stage recess groove and a gate electrode is formed in the first-stage recess groove 3. By the same etching as described above, the second-stage recess groove 4 as shown in FIG. 9F is formed. Then, the amount of etching is adjusted so that the current flowing between the ohmic electrodes has a desired value. After a laminated gate metal 8, such as Ti/Au, Ti/Mo/Au, Ti/Pt/Au, Ti/Al/Mo or a refractory metal such as WSi is deposited on the entire surface by sputtering, a resist 12 is patterned in a desired area, thus forming a pattern as shown in FIG. 9G. After the gate metal 8 is patterned by RIE or ion milling, the resists 11 and 12 are removed, thus providing a semiconductor device as shown in FIG. 9H.

Since such a conventional semiconductor device has been fabricated in the process described above, the surface of the semiconductor substrate and the surface of the first-stage recess groove are exposed during the fabricating process. For this reason, during plasma processing or organic solvent processing in the fabricating process, the surface level is changed, an oxide film is formed and, impurities are deposited so that the surface condition is very unstable. The device structure formed by the conventional process cannot stably provide a desired device characteristic such as a withstand voltage and response speed, thus deteriorating the reliability.

SUMMARY OF THE INVENTION

The present invention has been completed in order to solve the problem described above.

An object of the present invention is to provide a semiconductor device which suppresses changes in the surface level, formation of an oxide film, deposition of impurities, etc. due to exposure of the semiconductor substrate surface, and first-stage recess groove, thereby giving a stable device characteristic and high reliability, and a method of fabricating the semiconductor device.

The semiconductor device according to the present invention comprises a semiconductor substrate with an active layer formed on its upper area; a first-stage recess groove formed in said semiconductor substrate; a surface passivation film covering said semiconductor substrate and the surface of said first-stage recess groove; an ohmic electrode formed on said semiconductor substrate opened in said surface passivation film; a second-stage recess groove formed in said first-stage recess groove opened in said surface passivation film; and a gate electrode vertically formed on said second-stage recess groove.

The surface passivation film is made of crystalline material lattice-aligned with the crystal of said semiconductor substrate.

The surface passivation film is made of at least one of i-GaAs, i-AlGaAs, i-InGaP and poly-GaAs.

The surface passivation film is a non-crystalline film of SiON or SiN.

The surface passivation film has a laminated structure composed of two or more layers comprising a film made of at least a part of crystal material and an insulating film.

The end of the ohmic electrode is formed so as to cover a boundary between it and said surface passivation film.

The semiconductor substrate has an etching stopper layer on either one or both of said first-stage recess groove forming surface and said second-stage recess groove forming surface.

A method of fabricating a semiconductor device according to the present invention comprises the steps of: forming a first-stage recess groove on a semiconductor substrate with an active layer by photolithography and wet or dry etching; forming a surface passivation film of crystalline material such as i-GaAs or an insulating film such as SiON on said semiconductor substrate and the surface of said first-stage recess groove; removing said surface passivation film on an area where said ohmic electrode is to be formed and forming said ohmic electrode on the area by vapor deposition; forming a second-stage recess groove on said first-stage recess groove by photolithography and wet or dry etching; and forming a gate electrode on said second-stage recess groove by sputtering or the like.

Another method of fabricating a semiconductor device comprises the steps of: forming a first surface passivation film of crystalline material such as i-GaAs on a semiconductor substrate with an active layer; forming a first-stage recess groove on said semiconductor substrate after said first surface passivation film has been formed, by photolithography and wet or dry etching; forming a second surface passivation film of an insulating film such as SiON on said first surface passivation film and the surface of said first-stage recess groove; removing said first and second surface passivation films on an area where an ohmic electrode is to be formed and forming said ohmic electrode on the area by vapor deposition; and forming a second-stage recess groove on said firs recess groove by photolithography and wet or dry etching; and forming a gate electrode in said second-stage recess groove by sputtering or the like.

In forming an ohmic electrode, vapor deposition is performed in an oblique direction while rotating the semiconductor substrate so that said ohmic electrode end covers the boundary between it and said surface passivation film.

Figure 1A:
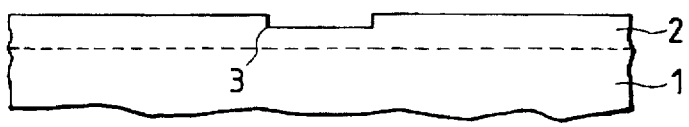
FIGS. 1A to 1H are sectional views showing a method of fabricating a semiconductor device according to a first embodiment of the present invention.

DETAILED DESCRIPTION OF THE PREFERRED EMBODIMENTS (Embodiment 1)

FIGS. 1A to 1H are sectional views showing the structure and fabricating method of a semiconductor device which is one embodiment of the present invention. In FIGS. 1A to 1H, reference numeral 5 denotes a highly resistive surface passivation film made of a crystalline material such as i-GaAs, i-AlGaAs, i-InGaP and poly-GaAs which can be lattice matched with GaAs or an insulating film such as SiON, SiN, etc.

Figure 1B:
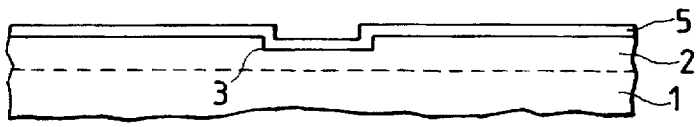
Figure 1C:
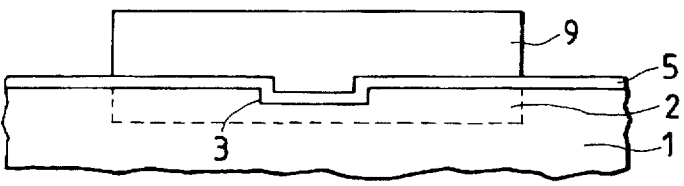

As shown in FIG. 1A, an active layer 2 is formed on a semiconductor substrate 1 of GaAs, InP, etc. by crystal growth such as MBE, MOCVD, etc, ion implantation and a resist is formed in a desired area. By wet etching using tartaric acid or dry etching using hydrochloric acid gas, a first-stage recess groove 3 having a depth of 500–4000 Å is etched. Thereafter, in removing the resist, because of absence of the electrode on the surface, it is possible to perform $O_2$ ashing or processing of organic solvent and further sufficient surface regenerative processing such as hydrofluoric acid treatment. As shown in FIG. 1B, a highly resistive surface passivation 5 having a thickness of 100–3000 Å is deposited. As shown in FIG. 1C, a resist 9 is patterned in a desired area, and after dielectric isolation by ion implanatation, the resist 9 is removed. Then, because of the presence of the surface passivation film 5, performing the $O_2$ ashing and organic solvent processing do not contaminate or deform the surface of the active layer 2.

Figure 1D:
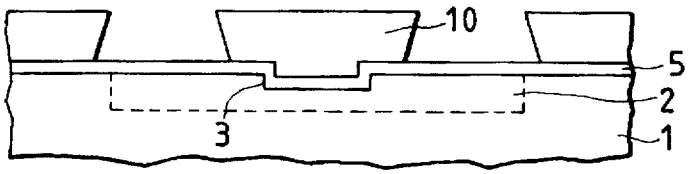
Figure 1E:
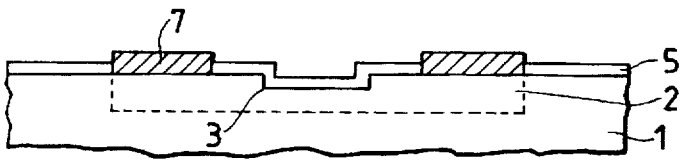
Figure 1F:
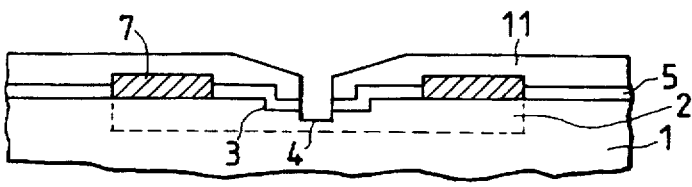
Figure 1G:
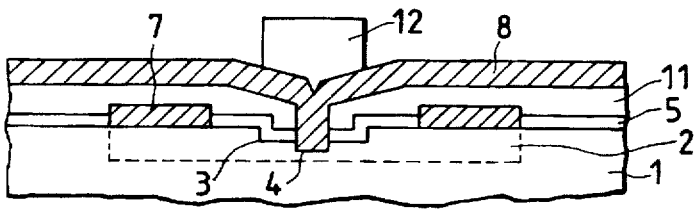
Figure 1H:
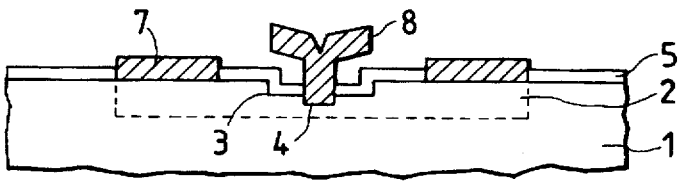

As shown in FIG. 1D, after a resist 10 for forming ohmic electrode is formed into desired areas, the surface passivation film 5 is removed in those and the ohmic electrode metal is deposited on the entire surface by vapor deposition. The resultant substrate is dipped in a solvent, such as acetone, to remove the resist and the film deposited on the resist 10, thus providing a pattern such as shown in FIG. 1E. Then, because of presence of the surface passivation film 5, $O_2$ ashing or organic solvent processing will not contaminate nor deform the surface of the active layer 2. The substrate is heat-treated at a temperature of 400° C. or lower to sinter the ohmic electrodes. A resist 11 for forming a second-stage recess groove and a gate electrode is formed in the first-stage recess groove 3. By the same etching as described above, the second-stage recess groove 4 as shown in FIG. 1F is formed. Then, the amount with an etching is adjusted so that the current flowing between the ohmic electrodes has a desired value. After laminated gate metal 8, of such as Ti/Au, Ti/Mo/Au, Ti/Pt/Au, Ti/Al/Mo or a refractory metal such as Wsi, is deposited on the entire surface by sputtering, a resist 12 is patterned in a desired area, thus forming a pattern as shown in FIG. 1G. After the gate metal 8 is worked by RIE or ion milling, the resists 11 and 12 are removed, thus providing a semiconductor device as shown in FIG. 1H. At this time also, because of the surface passivation film 5, the $O_2$ ashing and organic solvent processing do not contaminate nor deform the active layer 2.

In accordance with this embodiment, since the surface the GaAs semiconductor substrate and that of the first-stage recess groove 3 are not exposed during the fabricating process, a semiconductor device can be fabricated without being influenced by a change of the surface level due to a plasma, formation of an oxide film, or deposition of impurities, thus giving a stabilized characteristic and high reliability.

(Embodiment 2)

FIGS. 2A to 2H are sectional views showing the structure of such a semiconductor device and its fabricating method according to a second embodiment of the present invention. In the figure, reference numeral 5 denotes a first highly resistive surface passivation film made of crystalline material; and 6 a second surface passivation film which is an insulating film of SiON, SiN, etc. An explanation will be given of the method of fabricating a semiconductor device according to this embodiment.

Figure 2A:
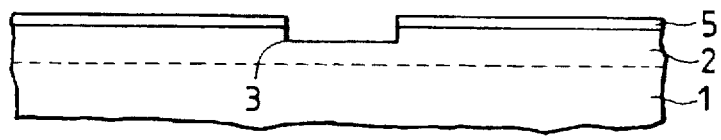
FIGS. 2A to 2H are sectional views showing a method of fabricating a semiconductor device according to a second embodiment of the present invention.
Figure 2B:
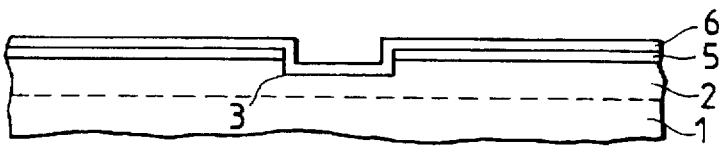
Figure 2C:
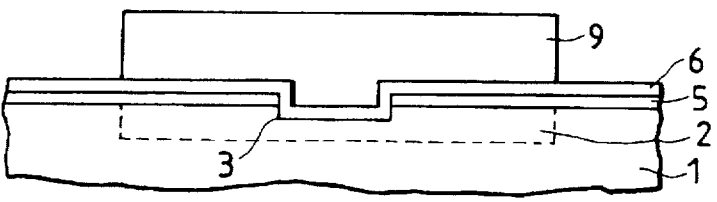

As shown in FIG. 2A, an active layer 2 is formed on a semiconductor substrate (wafer) 1 of GaAs, InP, etc. by crystal growth such as MBE, MOCVD, etc, ion implantation and diffusion. Thereafter a highly resistive surface passivation film 5 having a thickness of 100–3000 Å (i-GaAs, i-InGaAs, i-AlGaAs, poly-GaAs, etc.) is formed on the semiconductor substrate 1. A resist is formed in a desired area of the semiconductor substrate. By wet etching using tartaric acid or dry etching using hydrochloric acid gas, a first-stage recess groove 3 having a depth of 500–4000 Å is etched. Thereafter, in removing the resist, because of the absence of the electrode on the surface, it is possible to perform $O_2$ ashing or processing with an organic solvent and further sufficient surface regenerative processing such as hydrofluoric acid treatment. As shown in FIG. 2B, an insulating film 6 of SiON, SiN, etc., having a thickness of 100 –3000 Å is deposited. As shown in FIG. 2C, a resist 9 is patterned in a desired area, and after dielectric isolation by ion implantation, the resist 9 is removed. Then, because of the presence of the insulating film 6 and the surface passivation film 5, performing the $O_2$ ashing and organic solvent processing do not contaminate or deform the surface of the active layer 2.

Figure 2D:
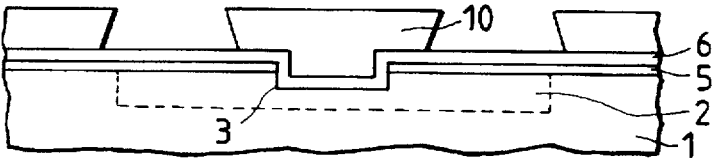
Figure 2E:
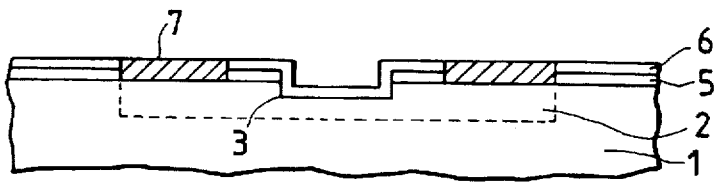
Figure 2F:
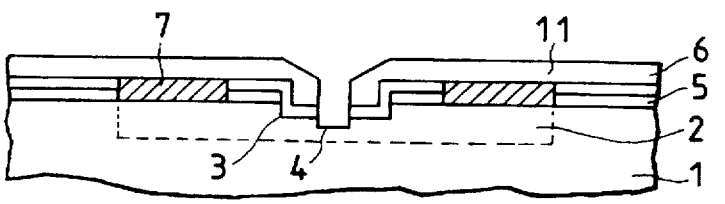
Figure 2G:
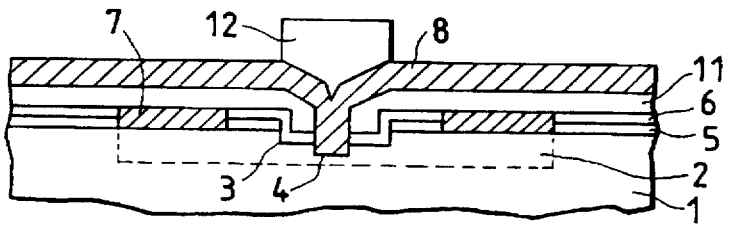
Figure 2H:
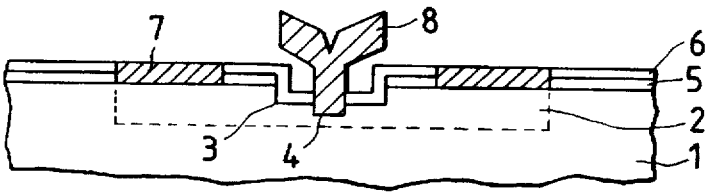

As shown in FIG. 2D, after a resist 10 for forming an ohmic electrode is formed in desired areas, the insulating film 6 and surface passivation film 5 are removed and the ohmic electrode is deposited on the entire surface by vapor deposition. The resultant substrate is dipped in solvent, such as acetone, to remove the resist and the film deposited on the resist 10, thus providing a pattern such as shown in FIG. 2E. In this case also, because of presence of the insulating film 6 and surface passivation film 5, O₂ ashing or organic solvent processing will not contaminate nor deform the surface of the active layer 2. The substrate is heat-treated at a temperature of 400° C. or lower to sinter the ohmic electrode. A resist 11 for forming a second-stage recess groove and a gate electrode is formed in the first-stage recess groove 3. By the same etching as described above, the second-stage recess groove 4 as shown in FIG. 2F is formed. Then, the amount of etching is adjusted so that the current flowing between the ohmic electrodes is a desired value. After laminated gate metal 8, of such as Ti/Au, Ti/Mo/Au, Ti/Pt/Au, Ti/Al/Mo or a refractory metal such as WSi, is deposited on the entire surface by sputtering, a resist 12 is patterned in a desired area, thus forming a pattern as shown in FIG. 2G. After the gate metal 8 is patterned by RIE or ion milling, the resists 11 and 12 are removed, thus providing a semiconductor device as shown in FIG. 2H. At this time also, because of the insulating film 6 and surface passivation film 5, the O₂ ashing and organic solvent processing do not contaminate nor deform the surface of the active layer 2.

In accordance with this embodiment, since the surface of GaAs which is a semiconductor substrate and that of the first-stage recess groove 3 are not exposed during the fabricating process, a semiconductor device can be fabricated without being influenced by a change of the surface level due to a plasma, formation of an oxide film, or deposition of impurities, thus giving a stabilized characteristic and high reliability. Further, since the crystalline surface passivation film 5 can be first formed in the fabrication process and crystal growth during processing is not required, the surface can be passivated or protected and the crystal growth apparatus such as MBE and MOCVD is not contaminated by gas emerging from the wafer.

(Embodiment 3)

FIGS. 3A to 3H are sectional views showing the structure and fabricating method of a semiconductor device which is the third embodiment of the present invention.

Figure 3A:
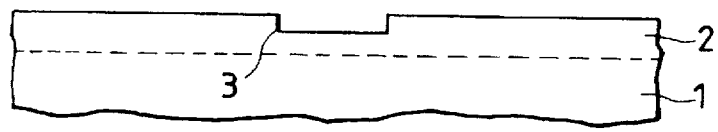
FIGS. 3A to 3H are sectional views showing a method of fabricating a semiconductor device according to a third embodiment of the present invention.
Figure 3B:
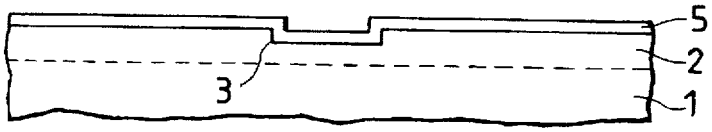
Figure 3C:
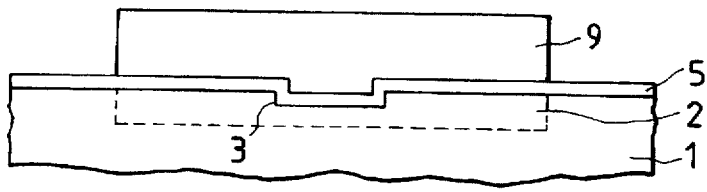

As shown in FIG. 3A, an active layer 2 is formed on a semiconductor substrate 1 of GaAs, InP, etc. by crystal growth such as MBE, MOCVD, etc, ion implantation and a resist is formed in a desired area. By wet etching using tartaric acid or dry etching using hydrochloric acid gas, a first-stage recess groove 3 having a depth of 500–4000 Å is formed Thereafter, in removing the resist, because of the absence of an electrode on the surface, it is possible to perform O₂ ashing or processing with an organic solvent and further sufficient surface regenerative processing such as hydrofluoric acid treatment. As shown in FIG. 3B, a highly resistive surface passivation film 5 (which is a crystalline film lattice-matched with GaAs such as i-GaAs, i-InGaAs, i-AlGaAs, poly-GaAs, etc., or an insulating film of SiON, SiN) having a thickness of 100–3000 Å is deposited. As shown in FIG. 3C, a resist 9 is patterned in a desired area, and after dielectric isolation by ion implantation, the resist 9 is removed. Then, because of the presence of the surface passivation film 5, performing the O₂ ashing and organic solvent processing does not contaminate or deform the surface of the active layer 2.

Figure 3D:
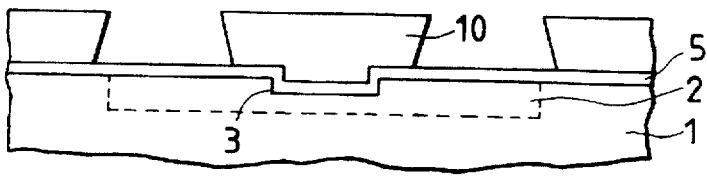
Figure 3E:
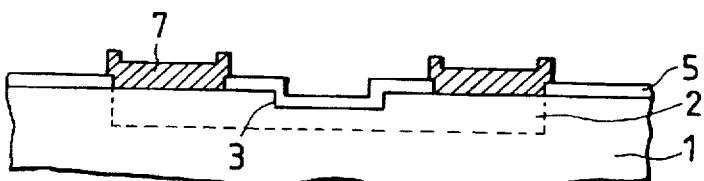
Figure 3F:
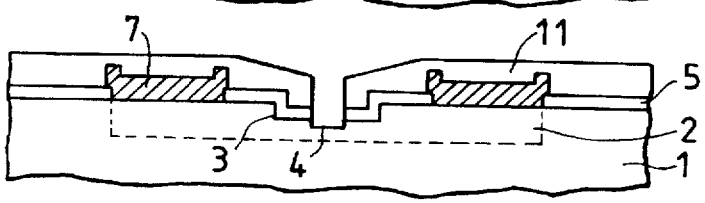
Figure 3G:
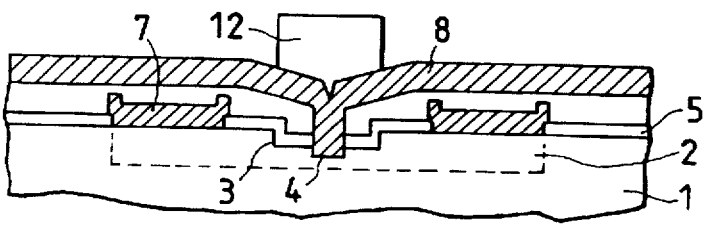
Figure 3H:
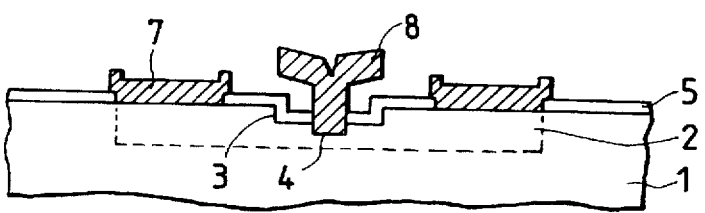

As shown in FIG. 3D, after a resist 10 for forming an ohmic electrode is formed into desired areas, the surface passivation film 5 is removed and an ohmic electrode metal is deposited on the entire surface by vapor deposition. By vapor deposition in an oblique direction while rotating the wafer, an ohmic electrode 7 is formed covering the opening of the surface passivation film 5. The resultant substrate is dipped in a solvent, such as acetone, to remove the resist and the film deposited on the resist 10, thus providing a pattern such as shown in FIG. 3E. Then, because of presence of the surface passivation film 5, O₂ ashing or organic solvent processing will not contaminate nor deform the surface of the active layer 2. The substrate is heat-treated at the temperature of 400° C. or lower to sinter the ohmic electrodes. A resist 11 for forming a second-stage recess groove and a gate electrode is formed in the first-stage recess groove 3. By the same process as described above, the second-stage recess groove 4 as shown in FIG. 3F is formed. Then, the amount of etching is adjusted so that the current flowing between the ohmic electrodes has a desired value. After laminated gate metal 8, of such as Ti/Au, Ti/Mo/Au, Ti/Pt/Au, Ti/Al/Mo or a refractory metal such as WSi, is deposited on the entire surface by sputtering, a resist 12 is patterned in a desired area, thus forming a pattern as shown in FIG. 3G. After the gate metal 8 is patterned by RIE or ion milling, the resists 11 and 12 are removed, thus providing a semiconductor device as shown in FIG. 3H. At this time also, because of the surface passivation film 5, the O₂ ashing and organic solvent processing do not contaminate nor deform the surface of the active layer 2.

In accordance with this embodiment, since the surface of GaAs, which is a semiconductor substrate, and that of the first-stage recess groove 3 are not exposed during the fabricating process and there is no gap between the edge of the ohmic electrode 7 and the opening of the surface passivation film as compared with the first embodiment, a semiconductor device can be fabricated without being influenced by a change of the surface level due to a plasma, formation of an oxide film, or deposition of impurities, thus giving a stabilized characteristic and high reliability.

(Embodiment 4)

Figure 4:
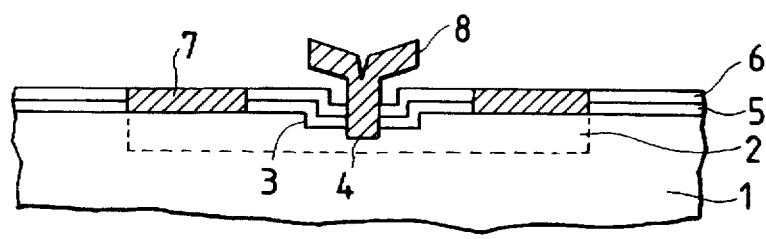
FIG. 4 is a sectional view showing a method of fabricating a semiconductor device according to a fourth embodiment of the present invention.

The surface passivation film 5 made of crystalline material or insulating film in Embodiment 1 may be replaced by a laminated surface passivation film 5 and the insulating film 6 as shown in FIG. 4.

(Embodiment 5)

Figure 5:
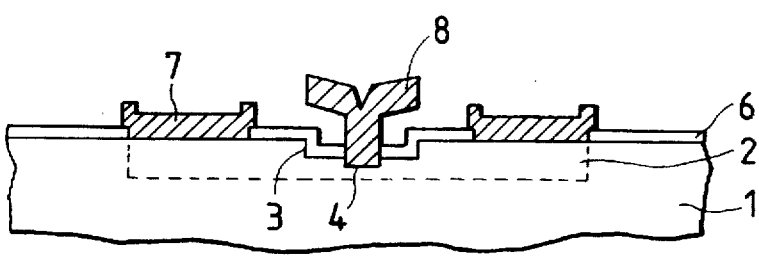
FIG. 5 is a sectional view showing a modification of the semiconductor device according to the first embodiment of the present invention.
Figure 6:
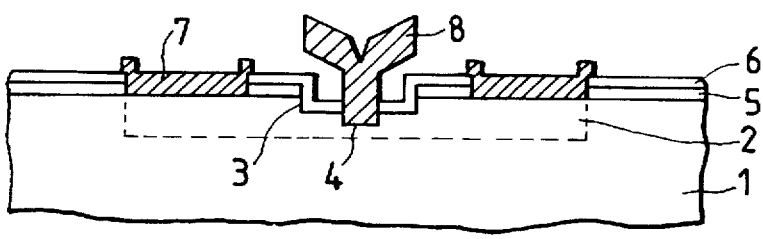
FIG. 6 is a sectional view showing a modification of the semiconductor device according to the second embodiment of the present invention.
Figure 7:
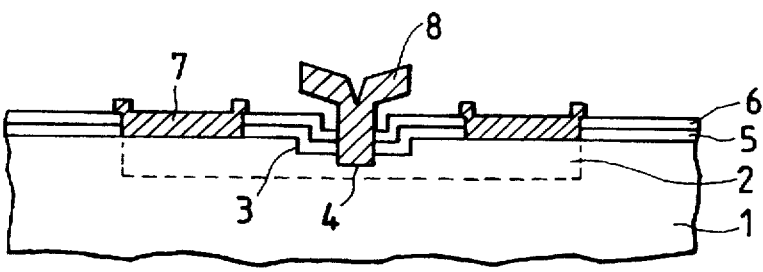
FIG. 7 is a sectional view showing a modification of the semiconductor device according to the fourth embodiment of the present invention.

As shown in FIGS. 5 to 7, in any of Embodiments 1, 2 and 4, the ohmic electrode 7 may be extended over the surface passivation film 5 or insulating film 6.

(Embodiment 6)

Figure 8:
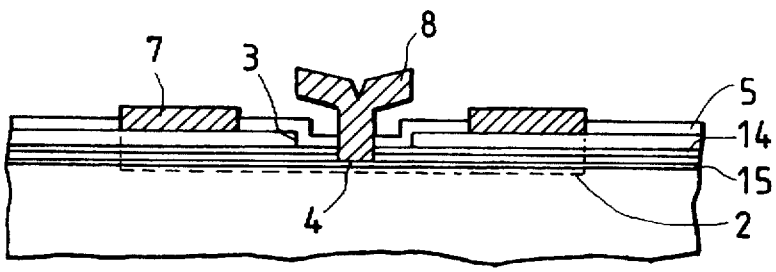
FIG. 8 is a sectional view showing a modification of the semiconductor device according to the sixth embodiment of the present invention.
Figure 9A:
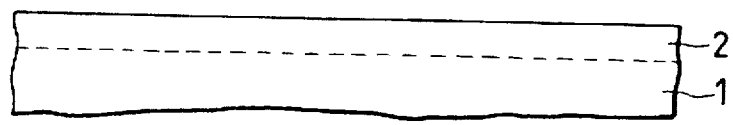
FIGS. 9A to 9H are sectional views showing a method of fabricating a conventional semiconductor device.
Figure 9B:
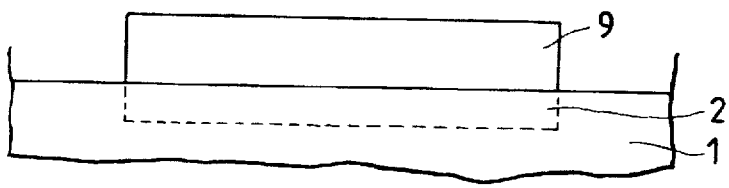
Figure 9C:
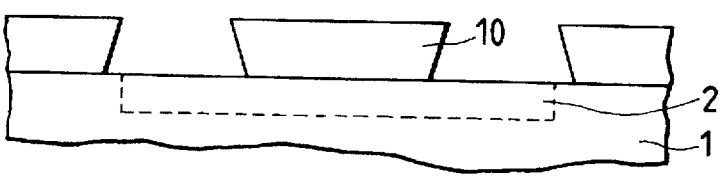
Figure 9D:
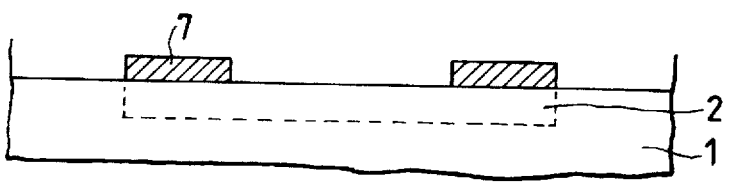
Figure 9E:
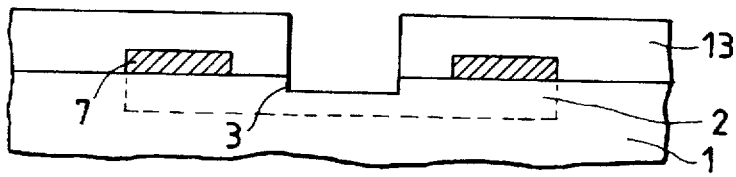
Figure 9F:
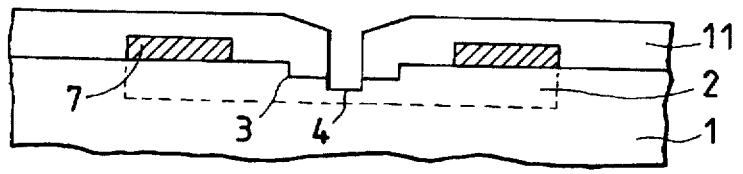
Figure 9G:
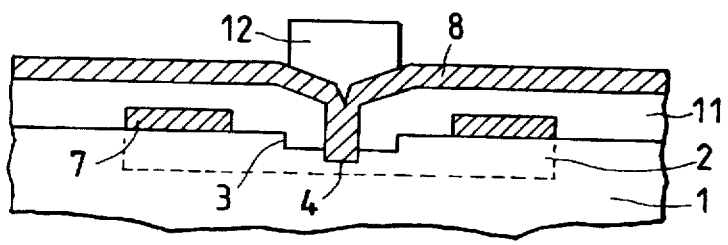
Figure 9H:
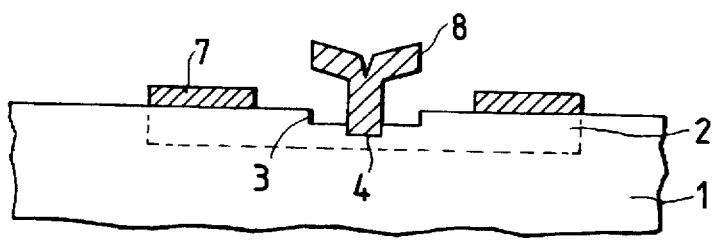

In order to improve uniformity of the etching depth of the first-stage and second-stage recess grooves 3 and 4, etching stopper layers 14 and 15 (made of AlGaAs, InGaAs, etc.) may be previously formed on the semiconductor substrate 1 where the first-stage and second-stage recess grooves are to be formed as shown in FIG. 8 so that selective etching for GaAs, such as wet etching using citric acid or dry etching using gaseous chlorine compound containing F (fluorine), can be performed. The etching stopper may be formed for only either one of the first-stage and second-stage recess grooves.

In this way, since the etching stopper(s) is present on one or both of the surfaces where the first-stage and second-stage recess grooves are to be formed, uniformity in the depth of the recess groove(s) can be improved.

As described above, in accordance with the present invention, since the surfaces of the semiconductor substrate and the first-stage recess groove are not exposed during the fabricating process because of presence of the surface passivation film, a semiconductor device can be fabricated without being influenced by a change of the surface level due to a plasma, formation of an oxide film, a deposition of impurities, thus giving a stabilized characteristic and high reliability.

What is claimed is:

1. A semiconductor device comprising:
   a semiconductor substrate including an active layer at an upper surface of said semiconductor substrate;
   a first-stage recess groove in said semiconductor substrate in said active layer, the first-stage recess groove having a bottom surface and side surfaces;
   a high resistivity surface passivation film covering the upper surface of said semiconductor substrate and disposed on and covering the side surfaces and part of the bottom surface of the first-stage recess groove;
   an ohmic electrode disposed on the upper surface of said semiconductor substrate in and filling a first opening in said surface passivation film, the first opening exposing the upper surface of said semiconductor substrate;
   a second-stage recess groove within the first-stage recess groove and including a second opening in said surface passivation film, within the first-stage recess groove, the second opening exposing said active layer; and
   a gate electrode disposed within the first-stage and second-stage recess grooves and contacting said active layer in and filling the second opening in said surface passivation film, wherein said gate electrode has a T-shape in a cross section transverse to said semiconductor substrate and said high resistivity surface passivation film contacts but does not cover either of said ohmic electrode and said gate electrode.

2. The semiconductor device of claim 1, wherein said high resistivity surface passivation film is a crystalline material lattice-matched with said semiconductor substrate.

3. The semiconductor device of claim 1, wherein said high resistivity surface passivation film is a semiconductor selected from the group consisting of i-GaAs, i-AlGaAs, i-InGaP, and poly-GaAs.

4. The semiconductor device of claim 1, wherein said high resistivity surface passivation film is a noncrystalline film selected from the group consisting of SiON and SiN.

5. A semiconductor device comprising:
   a semiconductor substrate including an active layer at an upper surface of said semiconductor substrate;
   a first-stage recess groove in said semiconductor substrate in said active layer;
   a high resistivity surface passivation film covering the upper surface of said semiconductor substrate and disposed on and covering the side surfaces and part of the bottom surface of the first-stage recess groove.
   an ohmic electrode disposed on the upper surface of said semiconductor substrate in and filling a first opening in said surface passivation film, the first opening exposing the upper surface of said semiconductor substrate;
   a second-stage recess groove within the first-stage recess groove and including a second opening in said surface passivation film, within the first-stage recess groove, the second opening exposing said active layer; and
   a gate electrode disposed within the first-stage and second-stage recess grooves, contacting said active layer in and filling the second opening in said surface passivation film, wherein said high resistivity surface passivation film contacts but does not cover either of said ohmic electrode and said gate electrode, said high resistivity surface passivation film including a crystalline material and an insulating film.

6. The semiconductor device of claim 1, wherein an end of said ohmic electrode extends beyond and covers an interface between said ohmic electrode and said high resistivity surface passivation film.

7. The semiconductor device of claim 1, including an etching stopper layer on at least one of the first-stage recess groove and the second-stage recess groove.

* * * * *